US006436593B1

(12) United States Patent
Minegishi et al.

(10) Patent No.: US 6,436,593 B1
(45) Date of Patent: Aug. 20, 2002

(54) POSITIVE PHOTOSENSITIVE RESIN COMPOSITION, PROCESS FOR PRODUCING PATTERN AND ELECTRONIC PARTS

(75) Inventors: Tomonori Minegishi, Austin, TX (US); Makoto Kaji, Hitachi (JP)

(73) Assignees: Hitachi Chemical DuPont Microsystems Ltd. (JP); Hitachi Chemical DuPont Microsystems LLC

( * ) Notice: Subject to any disclaimer, the term of this patent is extended or adjusted under 35 U.S.C. 154(b) by 0 days.

(21) Appl. No.: 09/666,541

(22) Filed: Sep. 21, 2000

(30) Foreign Application Priority Data

Sep. 28, 1999 (JP) ............................................. 11-274985
Sep. 28, 1999 (JP) ............................................. 11-274986
Aug. 4, 2000 (JP) ........................................ 2000-237798

(51) Int. Cl.[7] .......................... G03F 7/021; G03F 7/023; G03F 7/039; G03F 7/30
(52) U.S. Cl. ......................... 430/18; 430/176; 430/189; 430/270.1; 430/326; 430/906
(58) Field of Search ............................... 430/270.1, 906, 430/326, 18, 189, 176

(56) References Cited

U.S. PATENT DOCUMENTS

| 4,371,685 A | * | 2/1983 | Ahne et al. .................... 528/73 |
| 4,395,482 A | | 7/1983 | Hellmut et al. |
| 5,114,826 A | * | 5/1992 | Kwong et al. ............... 430/192 |
| 5,449,584 A | * | 9/1995 | Banba et al. ................ 430/190 |
| 6,143,467 A | * | 11/2000 | Hsu et al. ................. 430/270.1 |

FOREIGN PATENT DOCUMENTS

| JP | 49-115541 | | 11/1974 |
| JP | 51-40922 | | 4/1976 |
| JP | 52-13315 | | 2/1977 |
| JP | 54-145794 | A | 11/1979 |
| JP | 56-38038 | A | 4/1981 |
| JP | 59-108031 | A | 6/1984 |
| JP | 59-219330 | A | 12/1984 |
| JP | 59-220730 | A | 12/1984 |
| JP | 59-231533 | A | 12/1984 |
| JP | 59-232122 | A | 12/1984 |
| JP | 60-006729 | A | 1/1985 |
| JP | 60-072925 | A | 4/1985 |
| JP | 61-057620 | A | 3/1986 |
| JP | 64-60630 | A | 3/1989 |
| JP | 01-46862 | B2 | 10/1989 |
| JP | 03-000763 | A | 1/1991 |
| JP | 04-031861 | A | 2/1992 |
| JP | 04-046345 | A | 2/1992 |
| JP | 10-307393 | A | 11/1998 |
| JP | 11-202489 | A | 7/1999 |

OTHER PUBLICATIONS

J. Macromol. Sci.—Chem., A24 (12), pp. 1407–1422 (1987), "Positive Photoreactive Polyimides. II. Preparation and Characterization of Polyimide Precursors Containing . . . " by Shigeru Kubota et al.

Macromolecules 1990, 23, pp. 4796–4802, "Fluorine–Containing Photoreactive Polyimides. 7. Photochemical Reaction of Pendant 1,2–Naphthoquinone Diazide Moieties in Novel Photoreactive Polyimides" by Toshihiko Omote et al.

Chemical Handbook, Basic Edition II, Item 365 (edited by The Chemical Society of Japan, published by Maruzen, Japan, 1984).

* cited by examiner

*Primary Examiner*—John S. Chu
(74) *Attorney, Agent, or Firm*—Griffin & Szipl, P.C.

(57) ABSTRACT

Disclosed are a positive type photosensitive resin composition which comprises (A) a polyimide precursor or a polyoxazole precursor having a group represented by —OR, wherein R represents a monovalent group constituting a acetal or ketal, an alkoxyalkyl group or an alkylsilyl group, which can be converted into a hydrogen atom by decomposition with an action of an acid, in the molecule which is bonded to an aromatic ring, and (B) a compound which generates an acid by irradiating radiation, a process for producing the same and electronic parts using the same.

13 Claims, 1 Drawing Sheet

POSITIVE PHOTOSENSITIVE RESIN COMPOSITION, PROCESS FOR PRODUCING PATTERN AND ELECTRONIC PARTS

BACKGROUND OF THE INVENTION

1. Field of the Invention

This invention relates to a heat-resistant positive type photosensitive resin composition containing a polyimide precursor or a polyoxazole precursor having photosensitivity, a process for producing a pattern and electronic parts using the same.

2. Background Art

For a surface protective film or an interlaminar insulation film of a semiconductor device, a polyimide resin having excellent heat resistance, electric characteristics, mechanical characteristics, etc. has heretofore been used. However, whereas a semiconductor element has now been required to be highly integrated and large-sized in recent years, an encapsulating resin package is required to be thin and small-sized. Thus, a system such as a surface application by LOC (lead on chip) or solder reflow has been employed so that a polyimide resin excellent in mechanical characteristics, heat-resistance, etc. than before has been earnestly desired.

On the other hand, a photosensitive polyimide in which photosensitive characteristics are provided to the polyimide resin itself has been used. When this material is used, there are characteristics that pattern formation steps can be simplified and complicated preparation processes can be shortened.

A heat-resistant photoresist comprising a photosensitive polyimide or a precursor thereof and uses thereof have been well known in the art. For example, as a negative type material, there have been proposed a method of introducing a methacryloyl group into a polyimide precursor through an ester bond or an ionic bond (Japanese Provisional Patent Publications No. 115541/1974, No. 40922/1976, No. 145794/1979, No. 38038/1981, etc.), a soluble polyimide having a photopolymerizable olefin (Japanese Provisional Patent Publications No. 108031/1984, No. 220730/1984, No. 232122/1984, No. 6729/1985, No. 72925/1985, No. 57620/1986, etc.), a self-sensitization type polyimide having a benzophenone skeleton and an alkyl group at an ortho position of an aromatic ring to which a nitrogen atom is to be bonded (Japanese Provisional Patent Publications No. 219330/1984, No. 231533/1984, etc.), and the like.

In the above-mentioned negative type material, an organic solvent such as N-methylpyrrolidone, etc. is required at the time of development so that, in recent years, a positive type photosensitive resin which can be developed by an aqueous alkaline solution has now been proposed. As a positive type material, there have been proposed a method of introducing an o-nitrobenzyl group into a polyimide precursor through an ester bond (J. Macromol. Sci. Chem., A24, 12, 1407, 1987), a method of mixing a naphthoquinone azide compound with a soluble hydroxylimide or a polyoxazole precursor (Japanese Provisional Patent Publication No. 60630/1989, U.S. Pat. No. 4,395,482), a method of introducing a naphthoquinone diazide compound into a soluble polyimide through an ester bond (Macromolecules, 23,pp. 4796–4802, 1990), a chemical amplification type polyimide (Japanese Provisional Patent Publication No. 763/1995), a material in which naphthoquinone diazide is mixed with a polyimide precursor (Japanese Provisional Patent Publication No. 13315/1977), a method of using an acid generator with a polyamide acid ester or a polyamide phenol in which the phenolic hydroxyl group is protected by an alkoxycarbonyl group (Japanese Provisional Patent Publication No. 202489/1999), and the like.

However, in the above-mentioned negative type material, there are problems in their function or resolution, or depending on the uses, lowering in yield at production occurs. Also, in the above-mentioned materials, a structure of the polymer to be used is restricted so that physical properties of a film finally obtained are also restricted and they are not suitable for multi-purpose use. On the other hand, in the positive type materials, there are similar problems that sensitivity or resolution is low due to the problem accompanied by an absorption wavelength of a photosensitive agent as mentioned above, or its structure is restricted. Moreover, in the above mentioned materials, there are problems that a film thickness is decreased by a high temperature treatment after formation of an image or a pattern shape is deteriorated due to an effect of a basic component existing in air with a minute amount.

Also, there are materials in which a diazonaphthoquinone compound is mixed with a polybenzoxazole precursor (Japanese Patent Publication No. 46862/1989) or a phenolic hydroxyl group is introduced in place of a carboxylic acid such as those in which a phenol portion is introduced into a polyamic acid through an ester bond (Japanese Provisional Patent Publication No. 307393/1998), but these materials are insufficient in development and decrease in film thickness at an unexposed portion or peeling of a resin from a substrate occurs. Also, to improve developability or adhesive property of a material, a material in which a polyamic acid having a siloxane structure in the polymer skeleton has been proposed (Japanese Provisional Patent Publications No. 31861/1992 and No. 46345/1992), but it contains the polyamic acid so that preservation stability becomes poor as mentioned above. Also, these materials use diazoquinone compounds containing a number of aromatic rings as an acid generating agent so that there is a problem that mechanical properties after thermal curing are markedly decreased so that they cannot be used as a practically applicable material.

Thus, either of the materials cannot be practically used as of today.

SUMMARY OF THE INVENTION

The present invention is to provide a heat-resistant positive type photosensitive resin composition which can solve the above-mentioned problems possessed by the conventional photoresist, which can sufficiently endure even when a polyimide precursor or a polybenzoxazole precursor which provide photosensitivity has any structure, and has good sensitivity and resolution, and is less affected by a basic component existing in air with a minute amount, by formulating a compound which can induce an elimination reaction of a protective group in a polyimide precursor or a polybenzoxazole precursor in which an alkali-soluble group had been protected by an eliminatable group under acidic conditions by irradiating radiation to the polyimide precursor or the polybenzoxazole precursor.

Also, the present invention is to provide a process for producing a pattern which can give a pattern capable of being developed by an alkaline aqueous solution, excellent in sensitivity, resolution and heat-resistance, and a pattern having good shape can be obtained.

Also, the present invention is to provide electronic parts having high reliability by having a pattern with good shape and characteristics.

The present invention relates to the following.
1) A positive type photosensitive resin composition which comprises
   (A) a polyimide precursor or a polyoxazole precursor having a group represented by —OR, wherein R represents a monovalent group constituting a acetal or ketal, an alkoxyalkyl group or an alkylsilyl group, which can be converted into a hydrogen atom by decomposition with an action of an acid, in the molecule which is bonded to an aromatic ring, and
   (B) a compound which generates an acid by irradiating radiation.
2) A positive type photosensitive resin composition as defined above, wherein the component (A) is a polyimide precursor having a structural unit represented by the formula (1):

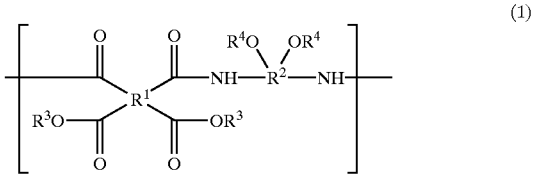

(1)

wherein $R^1$ and $R^2$ each independently represent a tetravalent organic group; each $R^3$ independently represents a monovalent organic group; each $R^4$ independently represents a monovalent group constituting acetal or ketal, an alkoxyalkyl group or an alkylsilyl group, which can be converted into a hydrogen atom by decomposition with an action of an acid.

3) A positive type photosensitive resin composition as defined above, wherein (B) the compound which generates an acid by irradiating radiation is contained in an amount of 0.01 to 50 parts by weight based on 100 parts by weight of (A) the polyimide precursor.

4) A positive type photosensitive resin composition as defined above, wherein $R^1$ in the formula (1) is, in an aromatic group(s) having four bonding arms, a tetravalent group having a chemical structure of an aromatic group substituted by an aprotic electron donative group or a fluorinated alkyl group.

5) A positive type photosensitive resin composition as defined above, wherein $R^2$ in the formula (1) is, in an aromatic group having four bonding arms or aromatic groups having bonding arms and adjacent to each other through an ether bond(s), a tetravalent group having a chemical structure of an aromatic group substituted by an aprotic electron donative group.

6) A positive type photosensitive resin composition as defined above, wherein Component (A) is a polyoxazole precursor having a structural unit represented by the following formula (2):

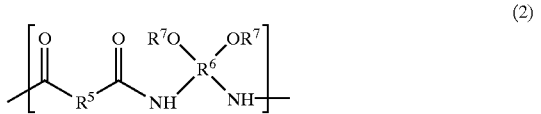

(2)

wherein $R^5$ represents a divalent organic group, $R^6$ represents a tetravalent organic group, and each of $R^7$s independently represents a monovalent group constituting acetal or ketal, an alkoxyalkyl group or an alkylsilyl group, which can be converted into a hydrogen atom by decomposition with an action of an acid.

7) A positive type photosensitive resin composition as defined above, wherein (B) the compound which generates an acid by irradiating radiation is contained in an amount of 0.01 to 50 parts by weight based on 100 parts by weight of (A) the polyoxazole precursor.

8) A process for producing a pattern comprising the steps of: a step of coating the positive type photosensitive resin composition as defined above on a support and drying the same, a step of subjecting to exposure, a step of developing the exposed material by using an aqueous alkaline solution and a step of subjecting to heat treatment.

9) Electronic parts which have the pattern prepared by the process as mentioned above as a surface protective film or an interlayer insulating film.

DESCRIPTION OF THE PREFERRED EMBODIMENTS

Figure 1A:
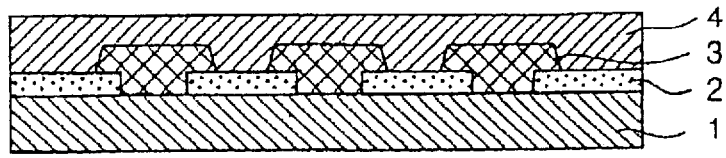
FIG. 1 is a drawing showing preparation steps of a semi-conductor device having a multi-layer wiring structure.

In the following, the present invention is explained in detail.

In the present invention, Component (A) is a polyimide precursor of a polyoxazole precursor and it is essential to have a group represented by —OR (wherein R represents a monovalent group constituting a acetal or ketal, an alkoxyalkyl group or an alkylsilyl group, which can be converted into a hydrogen atom by decomposition with an action of an acid) which is bound to an aromatic group in the molecule.

If the above R is converted into a hydrogen atom by decomposition with an action of an acid, a phenolic hydroxyl group is generated so that it provides suitable alkali solubility to the composition of the present invention.

This group may be present, in the polyimide precursor, in the residue of tetracarboxylic acid, in the diamine residue, or in the side chain, etc., and the number of the group is preferably 2 or more, more preferably 2 to 4 per the structural unit (i.e., a recurring unit containing one tetracarboxylic acid residue and one diamine residue) of the polyimide precursor.

Also, this group may be present, in the polyoxazole precursor, in the residue of dicarboxylic acid, in the diamine residue, or in the side chain, etc., and the number of the group is preferably 2 or more, more preferably 2 to 4 per the structural unit (i.e., a recurring unit containing one dicarboxylic acid residue and one dihydroxydiamine residue) of the polyoxazole precursor.

As the monovalent group constituting a acetal or ketal which can be converted into a hydrogen atom by decomposition with an action of an acid, there may be mentioned, for example, those having the following structure:

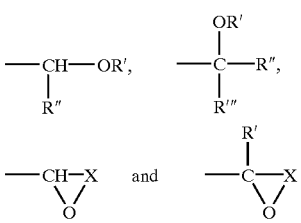

wherein R', R" and R'" each independently represents an alkyl group having 5 or less carbon atoms, and X represents a divalent alkylene group (which may have a side chain) having 3 or more carbon atoms (preferably 20 or less carbon atoms).

More specifically, there may be typically mentioned a tetrahydropyranyl group, a tetrahydrofuranyl group, an alkyl-substituted tetrahydropyranyl group, an alkyl-substituted tetrahydrofuranyl group, an alkoxy-substituted tetrahydropyranyl group, an alkoxy-substituted tetrahydrofuranyl group, etc., but the present invention is not limited by these.

The most preferred group is a tetrahydropyranyl group.

The monovalent alkoxyalkyl group or the alkylsilyl group, which can be converted into a hydrogen atom by decomposition with an action of an acid is not particularly limited, and preferred carbon number thereof is 2 to 5 for the alkoxyalkyl group and 1 to 20 for the alkylsilyl group.

More specifically, there may be typically mentioned a ri methoxymethyl group, an ethoxymethyl group, an isopropoxymethyl group, a t-butoxymethyl group, an ethoxyethyl group, a methylsilyl group, an ethylsilyl group, a t-butyldimethylsilyl group, etc., but the present invention is not limited by these.

The most preferred group is an ethoxymethyl group and a t-butyldimethylsilyl group.

When Component (A) is a polyimide precursor, the structure is not specifically limited, and the polyimide precursor having the structural unit represented by the above formula (1) is preferred since it shows excellent transparency at an i-line region, solubility in an alkali developer when the group represented by $R^4$ is converted into H, and adhesiveness to the substrate.

Also, when Component (A) is a polyoxazole precursor, the structure is not specifically limited, and the polyoxazole precursor having the structural unit represented by the above formula (2) is preferred since it shows excellent transparency at an i-line region, solubility in an alkali developer when the group represented by $R^3$ is converted into H, and adhesiveness to the substrate.

In the following, the polyimide precursor is firstly explained in detail.

In the polyimide precursor, $R^1$ in the structural unit represented by the formula (1) may be specifically mentioned, for example, a tetravalent aromatic hydrocarbon residue having a skeleton such as benzene, naphthalene, perylene, biphenyl, diphenyl ether, diphenyl sulfone, diphenylpropane, diphenylhexafluoropropane, benzophenone, etc., a tetravalent aliphatic hydrocarbon residue having a skeleton such as butane, cyclobutane, etc., but the present invention is not limited by these. The carbon number thereof is preferably 4 to 30. Preferred examples thereof are phenyl, biphenyl, diphenyl ether and diphenylhexafluoropropane. Incidentally, if necessary, two or more kinds of groups exemplified above may be contained as $R^1$ in the molecule of the polyamic acid derivative.

$R^2$ in the structural unit represented by the formula (1) may be specifically mentioned, for example, a tetravalent aromatic hydrocarbon residue having a skeleton such as diphenyl ether, diphenyl thioether, benzophenone, diphenylmethane, diphenylpropane, diphenylhexafluoropropane, diphenylsulfoxide, diphenylsulfone, biphenyl, benzene, etc., but the present invention is not limited by these. The carbon number thereof is preferably 6 to 30. Preferred examples thereof are diphenylhexafluoropropane, diphenyl ether and biphenyl. Incidentally, if necessary, two or more kinds of groups exemplified above may be contained as $R^2$.

$R^3$ in the structural unit represented by the formula (1) may be specifically mentioned, for example, an aliphatic or aromatic hydrocarbon group having 1 to 10 carbon atoms such as a methyl group, an ethyl group, an isopropyl group, a t-butyl group, a phenyl group, a benzyl group, etc.; an alkoxyalkyl group having 2 to 10 carbon atoms such as a methoxyethyl group, etc., but the present invention is not limited by these. Of these, preferred are an isopropyl group and a benzyl group.

$R^4$ in the structural unit represented by the formula (1) is a monovalent group constituting acetal or ketal, an alkoxyalkyl group or an alkylsilyl group, which can be converted into a hydrogen atom by decomposition with an action of an acid, and the same with the above-mentioned R.

In the present invention, the polyimide precursor represented by the formula (1) can be produced by using a tetracarboxylic acid dianhydride represented by the following formula (3) and a diamino compound represented by the following formula (4) as a part of the starting materials.

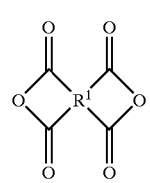

(3)

wherein $R^1$ has the same meaning as defined in the formula (1).

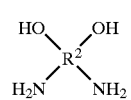

(4)

wherein $R^2$ has the same meaning as defined in the formula (1).

The polyimide precursor can be obtained, for example, according to the method as mentioned below. That is, the tetracarboxylic acid dianhydride represented by the above formula (3) and an alcohol or a phenol represented by the following formula (5) are allowing to react in an organic solvent such as N-methylpyrrolidone, γ-butyrolactone, N,N-dimethylacetamide, dimethylsulfoxide, etc., in the presence of a suitable catalyst such as pyridine, etc.

$$R^3\text{—OH} \qquad (5)$$

wherein $R^3$ has the same meaning as defined above.

$R^3$ in the structural unit represented by the formula (5) may be specifically mentioned, for example, an aliphatic or aromatic hydrocarbon group having 1 to 10 carbon atoms such as a methyl group, an ethyl group, an isopropyl group, a t-butyl group, a phenyl group, a benzyl group, etc.; an alkoxyalkyl group having 2 to 10 carbon atoms such as a methoxyethyl group, etc., but the present invention is not limited by these. Of these, preferred are an isopropyl group and a benzyl group.

Then, by using a halogenating agent such as thionyl chloride, the acid portion is halogenated, and then, the resulting compound is allowing to react with the diamino compound represented by the formula (4) in the presence of a suitable catalyst such as pyridine, etc., in an organic solvent which is the same as mentioned above.

The polyimide precursor obtained by the above-mentioned method is crystallized in a poor solvent such as water, methanol, ethanol, propyl alcohol, acetone, etc., collected by filtration and dried. Then, in an aprotic organic solvent such as tetrahydrofuran, N-methylpyrrolidone, γ-butyrolactone, N,N-dimethylacetamide, dimethylsulfoxide, etc., a protecting reaction is carried out by adding a protecting agent of a hydroxyl group having $R^4$, and if necessary, a reaction catalyst to the resulting material to obtain the polyimide precursor having the structural unit represented by the above-mentioned formula (1).

In the composition of the present invention, for making it suitable for an i-line exposure frequently been used at present, it is preferred to improve transparency of the resin at an i-line region.

For the above purpose, it is preferred that $R^1$ in the structural unit represented by the formula (3) is made a tetravalent group having a chemical structure of an aromatic group substituted by an aprotic electron donative group or a fluorinated alkyl group in the aromatic group(s) having four bonding arms.

Also, it is preferred that $R^2$ in the structural unit represented by the formula (4) is made a tetravalent group having a chemical structure of an aromatic group substituted by an aprotic electron donative group in the aromatic group(s) having four bonding arms or an aromatic group(s) having the same and adjacent thereto through an ether bond.

As the specific examples of the above-mentioned carboxylic acid dianhydride having a chemical structure of an aromatic group substituted by an aprotic electron donative group, there may be specifically mentioned, for example, 3,3',4,4'-diphenyl ether tetracarboxylic acid dianhydride, 1,4-dimethoxy-2,3,5,6-benzenetetracarboxylic acid dianhydride, 1,4-ditrimethylsilyl-2,3,5,6-benzenetetracarboxylic acid dianhydride, 1,4-bis(3,4-dicarboxyphenoxy)benzene dianhydride, 1,3-bis(3,4-dicarboxyphenoxy)benzene dianhydride, 3,3',4,4'-diphenylmethane tetracarboxylic acid dianhydride, bis(3,4-dicarboxyphenoxy)dimethylsilane dianhydride, bis(3,4-dicarboxyphenoxy)methylamine dianhydride, 4,4'-bis(3,4-dicarboxyphenoxy)diphenylsulfone dianhydride, etc., and particularly preferably 3,3+,4,4'-diphenyl ether tetracarboxylic acid dianhydride. Here, the electron donative group refers to a substituent which takes a negative value in a $σ_p$ or $σ_m$ value of the Hammett's related rule. Such a rule and numerical values are well known, for example, Chemical Handbook, Basic Edition II, Item 365 (edited by The Chemical Society of Japan, published by Maruzen, Japan, 1984).

Also, as preferred specific examples of the carboxylic acid dianhydride having a chemical structure substituted by a fluorinated alkyl group, there may be mentioned, for example, 2,2-bis(3,4-dicarboxyphenyl)hexafluoropropane dianhydride, 2,2-bis(3,4-dicarboxyphenyl)1,1,1-trifluoropropane dianhydride, etc., and particularly preferably 2,2-bis(3,4-dicarboxyphenyl)hexafluoropropane dianhydride.

Also, as preferred specific examples of the diamino compound having a chemical structure of an aromatic group substituted by an aprotic electron donative group, there may be mentioned, for example, compounds wherein the above-mentioned $R^2$ is benzophenone, diphenylsulfone, diphenylsulfoxide, diphenylhexafluoropropane, bis(trifluoromethyl)biphenyl, etc.

In the polyimide precursor having the structural unit represented by the above-mentioned formula (1) of the present invention, a structural unit other than the structural unit represented by the formula (1) may be contained in the range which does not impair the effect of the present invention.

A molecular weight of the polyimide precursor of Component (A) is not particularly limited, and it is preferably 10,000 to 200,000 in terms of a weight average molecular weight. Incidentally, the molecular weight is measured by GPC (gel permeation chromatography) and calculated in terms of polystyrenes having standard molecular weights.

Next, the polyoxazole precursor is explained in detail.

In the polyoxazole precursor, $R^5$ in the structural unit represented by the formula (2) may be specifically mentioned, for example, a divalent aromatic hydrocarbon residue having a skeleton such as benzene, naphthalene, perylene, biphenyl, diphenyl ether, diphenylsulfone, diphenylpropane, diphenylhexafluoropropane, benzophenone, etc., or a divalent aliphatic hydrocarbon residue having a skeleton such as butane, cyclobutane, etc., but the present invention is not limited by these.

The carbon number thereof is preferably 4 to 30. Preferred examples thereof are phenyl, biphenyl, diphenyl ether and diphenylhexafluoropropane. Incidentally, if necessary, two or more kinds of groups exemplified above may be contained as $R^5$ in the molecule of the polyamide derivative.

$R^6$ in the structural unit represented by the formula (2) may be specifically mentioned, for example, a tetravalent aromatic hydrocarbon residue having a skeleton such as diphenyl ether, diphenyl thioether, benzophenone, diphenylmethane, diphenylpropane, diphenylhexafluoropropane, diphenylsulfoxide, diphenylsulfone, biphenyl, benzene, etc., but the present invention is not limited by these. The carbon number thereof is preferably 6 to 30. Preferred examples thereof are diphenylhexafluoropropane, diphenyl ether and biphenyl. Incidentally, if necessary, two or more kinds of groups exemplified above may be contained as $R^6$.

$R^7$ in the structural unit represented by the formula (2) is a monovalent group constituting acetal or ketal, an alkoxyalkyl group or an alkylsilyl group, which can be converted into a hydrogen atom by decomposition with an action of an acid, and the same with the above-mentioned R.

A substitution ratio of the protective group represented by $R^7$ for the hydrogen atom is preferably made 10 to 80%, more preferably 30 to 60%. If the substitution ratio is higher than the above, adhesiveness to the substrate is sometimes lowered while if it is lower than the above, a bad effect will occur in some cases that decrease in film thickness at an unexposed portion becomes large, and the like.

In the present invention, the polyoxazole precursor can be produced by using a dicarboxylic acid represented by the following formula (6) and a diamino compound represented by the following formula (7) as a part of the starting materials.

(6)

wherein $R^5$ has the same meaning as $R^5$ in the formula (2).

Specific examples of the dicarboxylic acid represented by the formula (6) may include, for example, 4,4'-dicarboxydiphenyl ether, phthalic acid, isophthalic acid, terephthalic acid, etc., a mixture thereof and a copolymer of at least two of the above compounds.

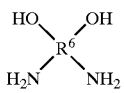

(7)

wherein $R^6$ has the same meaning as $R^6$ in the formula (2).

Specific examples of the diamino compound represented by the formula (7) may include, for example, 2,2-bis(3-amino-4-hydroxyphenyl)hexafluoropropane, 4,4'-diamino-3,3'-dihydroxybiphenyl, etc.

The above-mentioned polyoxazole precursor can be obtained, for example, according to the method as mentioned below.

That is, the dicarboxylic acid represented by the formula (6) is halogenated by using a halogenating agent such as thionyl chloride in an organic solvent such as N-methylpyrrolidone, γ-butyrolactone, N,N-dimethylacetamide, dimethylsulfoxide, etc., and then, the resulting compound is allowing to react with the diamino compound represented by the formula (7) in the presence of a suitable catalyst such as pyridine, etc., in an organic solvent which is the same as mentioned above.

The polyoxazole precursor obtained by the above-mentioned method is crystallized in a poor solvent such as water, methanol, ethanol, propyl alcohol, acetone, etc., collected by filtration and dried. Then, in an aprotic organic solvent such as tetrahydrofuran, N-methylpyrrolidone, γ-butyrolactone, N,N-dimethylacetamide, dimethylsulfoxide, etc., a protecting reaction is carried out by adding a protecting agent for a hydroxyl group having $R^7$, and if necessary, a reaction catalyst to the resulting material to obtain the polyimide precursor having the structural unit represented by the above-mentioned formula (2).

In the polyoxazole precursor having the structural unit represented by the above-mentioned formula (2) of the present invention, a structural unit other than the structural unit represented by the formula (2) may be contained. In such a case, the ratio is preferably 50 mol% or less in the whole constitutional units.

A molecular weight of the polyoxazole precursor of Component (A) is not particularly limited, and it is preferably 10,000 to 200,000 in terms of a weight average molecular weight. Incidentally, the molecular weight is measured by GPC (gel permeation chromatography) and calculated in terms of polystyrenes having standard molecular weights.

Incidentally, as Component (A), the polyimide precursor and the polyoxazole precursor may be used in admixture.

In the composition of the present invention, in combination with the polyimide precursor or the polyoxazole precursor to be used as Component (A), a compound which generates an acid by irradiating radiation (in the following, it is referred to as "an acid generator") is used as Component (B). An amount of Component (B) is preferably 0.01 to 50 parts by weight, more preferably 0.01 to 20 parts by weight, particularly preferably 5 to 15 parts by weight based on 100 parts by weight of Component (A) to improve sensitivity at exposure to light and resolution.

The acid generator (B) to be used in the present invention shows acidic property by irradiation of active light such as UV rays, and has a function of eliminating the protective group R in the polyimide precursor or the polyoxazole precursor of Component (A). As the compounds of Component (B), there may be specifically mentioned, for example, diaryl sulfonium salts, triaryl sulfonium salts, dialkylphenasyl sulfonium salts, diaryl iodonium salts, aryl-diazonium salts, aromatic tetracarboxylates, aromatic sulfonates, nitrobenzyl esters, aromatic N-oxyimidosulfonates, aromatic sulfamides, naphthoquinone diazide-4 -sulfonates, etc. These compounds may be used alone or in combination of two or more depending on necessity, or in combination with other sensitizer(s).

Of these, aromatic N-oxyimidosulfonates are preferred since high sensitivity can be expected and diaryl iodonium salts are also preferred since suitable dissolution preventing effect can be expected at an unexposed portion.

To the positive type photosensitive resin composition according to the present invention, an adhesive property-imparting agent for imparting adhesive property such as an organic silicon compound, a silane coupling agent, a leveling agent, etc. may be added, if necessary. Such an agent may be mentioned, for example, γ-aminopropyltrimethoxysilane, γ-aminopropyltriethoxysilane, vinyltriethoxysilane, γ-glycidoxypropyltriethoxysilane, -methacryloxypropyltrimethoxysilane, urea propyltriethoxysilane, tris(acetylacetonato) aluminum, acetylacetate aluminum diisopropylate, etc.

When the adhesive property-imparting agent is used, an amount thereof is preferably 0.1 to 20 parts by weight, more preferably 0.5 to 10 parts by weight based on 100 parts by weight of the polyimide precursor and/or the polyoxazole precursor.

In the present invention, these components are dissolved in a solvent and used in a varnish state. As the solvent, there may be mentioned, for example, N-methyl-2-pyrrolidone, γ-butyrolactone, N,N-dimethylacetamide, dimethylsulfoxide, 2-methoxyethanol, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol acetate, cyclohexanone, cyclopentanone, tetrahydrofuran, etc., and they may be used singly or in combination of two or more.

An amount of the solvent is not specifically limited, and it may be generally used in an amount of 40 to 75% by weight based on the total weight of the composition.

A process for producing a pattern using the positive type photosensitive resin composition of the present invention can be carried out firstly by coating said composition on a suitable support such as silicon wafer, ceramics, aluminum substrate, etc. As a coating method, there may be mentioned, for example, a rotary coating, spray coating using a spray coater, dipping, printing, roll coating, in etc. Next, the coated film is dried by pre-baking at 60 to 120° C., and then, irradiated by radiation or actinic radiation with a desired shape of pattern. As the radiation or actinic radiation, X rays, electron rays, UV rays, visible rays, etc., may be used and those having a wavelength of 200 nm to 500 nm are preferred. A monochromatic light such as g-line, i-line, etc. may be also used. Next, the exposed material is preferably heated to 50 to 150° C. to diffuse an acid generated at the surface layer of the irradiated portion to the bottom portion. Then, the exposed material is developed to dissolve and remove the exposed portion whereby a pattern can be obtained.

As a developer, there may be mentioned, for example, an aqueous alkaline solution containing an inorganic alkali such as sodium hydroxide, potassium hydroxide, sodium carbonate, sodium silicate, sodium metasilicate, ammonia, etc.; a primary amine such as ethylamine, n-propylamine, etc.; a secondary amine such as diethylamine, di-n-propylamine, etc.; a tertiary amine such as triethylamine, methyldiethylamine, etc.; an alcoholamine such as dimethylethanolamine, triethanolamine, etc.; a quaternary ammonium salt such as tetramethyl ammonium hydroxide, tetraethyl ammonium hydroxide, etc.; and an aqueous solution in which a water-soluble organic solvent or a surfactant is added to the above-mentioned aqueous alkaline solution with a suitable amount.

As a developing method, a system of spraying, paddle, dipping, ultrasonic wave, etc., may be useful. Next, the pattern formed by the development may be rinsed. As a rinsing solution, distilled water may be used. Next, a heat treatment is carried out to obtain a final pattern excellent in heat resistance. A heat treatment temperature is generally 150 to 450° C.

The photosensitive resin composition of the present invention can be employed for electronic parts such as a semi-conductor device or a multi-layer wiring board, etc., more specifically, it can be employed for formation of a surface protective film or an interlayer insulating film of a semiconductor device, or an interlayer insulating film of a multi-layer wiring board, etc. The semiconductor device according to the present invention is not specifically limited other than providing the surface protective film or interlayer insulating film by using the above composition of the present invention, and can take various structures.

In the following, one example of a preparation process of a semiconductor device according to the present invention will be described.

Figure 1B:
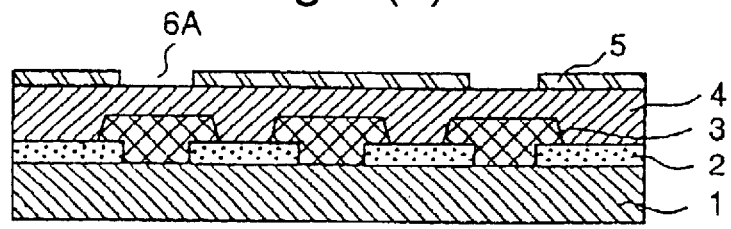
Figure 1C:
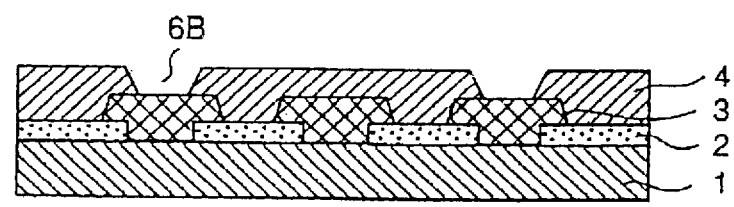
Figure 1D:
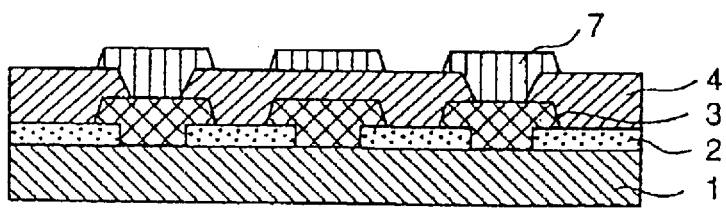
Figure 1E:
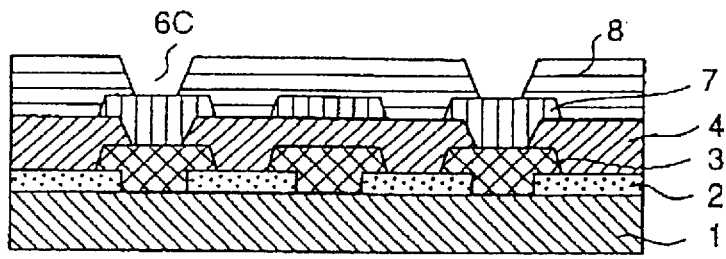

FIG. 1 is a drawing showing preparation steps of a semi-conductor device having a multi-layer wiring structure. In the drawing, a semiconductor substrate 1 such as a Si substrate having a circuit element is coated by a protective film 2 such as a silicon oxide film other than the predetermined portion of the circuit element, and a first conductive layer 3 is formed on the exposed circuit element. On the above-mentioned semiconductor substrate, an interlayer insulating film 4 is formed by the spin coating method. (Step (a))

Next, a photosensitive resin layer 5 such as a chloride rubber type, a phenol novolak type, etc., is formed on the above-mentioned interlayer insulating film 4, and a window 6A is provided by the conventionally known etching technique so that the predetermined portion of the interlayer insulating film 4 is exposed. (Step (b))

The interlayer insulating film 4 of the window 6A is selectively etched by a dry etching means using a gas such as oxygen, carbon tetrafluoride, etc., to open a window 6B. Then, the photosensitive resin layer 5 is completely removed by using an etching solution which etches only the photosensitive resin layer 5 without etching a first conductive layer 3 exposed from the window 6B. (Step (c))

Moreover, a second conductive layer 7 is formed by using the conventionally known technique to completely carry out electrical connection with the first conductive layer 3. (Step (d))

When a multi-layered wiring structure of three layers or more is to be formed, the above-mentioned steps are carried out repeatedly to form respective layers.

Next, a surface protective film 8 is formed. In the example of this drawing, the surface protective film 8 is formed by coating the above-mentioned photosensitive resin composition by the spin coating method, dried and irradiated by light on a mask drawing a pattern for forming a window 6C at a predetermined portion, then, developed by an aqueous alkaline solution to form a pattern, and heated to form a resin film. This resin film is to protect the conductive layer from a stress, a rays, etc. from outside, and the resulting semiconductor device is excellent in reliability.

Incidentally, in the above-mentioned example, it is also possible to form an interlayer insulating film by using the photosensitive resin composition of the present invention.

EXAMPLES

In the following, the present invention will be explained in more detail by referring to Examples.

Example 1

Synthesis of Polyamic Acid Ester

In 45 g of N,N-dimethylacetamide (DMAc) were dissolved 10 g of 3,3',4,4'-diphenyl ether tetracarboxylic acid dianhydride (ODPA) and 3.87 g of isopropyl alcohol, and after adding a catalytic amount of 1,8-diazabicyclo-[5.4.0] undecene, the mixture was heated at 60° C. for 2 hours, and stirred at room temperature for 15 hours to carry out esterification.

Thereafter, 7.1 g of thionyl chloride was added to the mixture under ice-cooling, and the resulting mixture was returned to room temperature and allowed to react for 2 hours. Then, 10.6 g of 2,2-bis(3-amino-4-hydroxyphenyl) hexafluoropropane and 4.67 g of pyridine dissolved in 45 g of DMAc were added to the above mixture under ice-cooling and the mixture was stirred at room temperature for 30 minutes. The reaction mixture was added dropwise to distilled water and precipitates were collected by filtration and dried under reduced pressure to obtain a polyamic acid ester. A weight average molecular weight of this material was 24,000 and a number average molecular weight of the same was 17,000.

Protecting Reaction of Phenolic Hydroxyl Group

In 50 g of tetrahydrofuran was dissolved 10 g of the polyamic acid ester obtained by the above, and 26 g of 2,3-dihydropyrane and a catalytic amount of p-toluenesulfonic acid were added to the solution, and the resulting mixture was stirred at room temperature for one hour. This reaction mixture was added dropwise to distilled water and precipitates were collected by filtration and dried under reduced pressure to obtain a polyimide precursor represented by the formula (1). A substitution ratio for the hydroxyl group of the resulting material by the tetrahydropyranyl group was 54%.

Evaluation of Photosensitive Characteristics

To 100 parts by weight of the above-mentioned polyimide precursor was added 15 parts by weight of dimethoxyanthracenesulfonic acid diphenyl iodonium as a compound which generates an acid by irradiation of radiation, and the mixture was dissolved in 2-methoxyethanol.

The above-mentioned solution was subjected to spin coating on a silicon wafer to form a coating film with a dry film thickness of 2 to 3 $\mu$m, and then, an i-line (365 nm) exposure was carried out by using a ultra high-pressure mercury lamp through an interference filter.

After exposure, the exposed material was heated at 90° C. for 5 minutes, developed by a mixed solution of an aqueous 2.38% by weight tetramethylammonium hydroxide solution and methanol (volume ratio 5:1) until the silicon wafer at the exposed portion was exposed, and rinsed by water. As a result, a good pattern with a resolution of 10 $\mu$m and a film remaining ratio at the unexposed portion of 90% could be obtained. An exposure dose at this time was 200 mJ/cm$^2$. Incidentally, after exposure, deterioration in a pattern shape was not observed even when the material was allowed to stand for 30 minutes to 2 hours before the heating step.

Example 2

In the same manner as in Example 1 except for changing tetracarboxylic acid dianhydride used in Example 1 to 2,2-bis(3,4-dicarboxyphenyl)hexafluoropropane dianhydride, a polyimide precursor was synthesized (a weight average molecular weight: 14,500, a number average molecular weight: 11,000) and evaluation of the photosensitive characteristics was carried out in the same manner as in Example 1. As a result, a good pattern with a resolution of 6 μm and a film remaining ratio at the unexposed portion of 92% could be obtained. An exposure dose at this time was 200 mJ/cm$^2$. Incidentally, after exposure, deterioration in a pattern shape was not observed even when the material was allowed to stand for 30 minutes to 2 hours before the heating step.

Example 3

In Example 1, the compound which generates an acid by irradiation of radiation was changed to naphthalimidyl triflate and an aqueous 2.38% by weight tetramethylammonium hydroxide was used as a developer, evaluation of the photosensitive characteristics was carried out in the same manner as in Example 1. As a result, a good pattern with a resolution of 8 μm and a film remaining ratio at the unexposed portion of 92% could be obtained. An exposure dose at this time was 150 mJ/cm$^2$. Incidentally, after exposure, deterioration in a pattern shape was not observed even when the material was allowed to stand for 30 minutes to 2 hours before the heating step.

Example 4

In Example 2, the compound which generates an acid by irradiation of radiation was changed to naphthalimidyl triflate and an aqueous 2.38% by weight tetramethylammonium hydroxide was used as a developer, evaluation of the photosensitive characteristics was carried out in the same manner as in Example 1. As a result, a good pattern with a resolution of 8 μm and a film remaining ratio at the unexposed portion of 90% could be obtained. An exposure dose at this time was 100 mJ/cm$^2$. Incidentally, after exposure, deterioration in a pattern shape was not observed even when the material was allowed to stand for 30 minutes to 2 hours before the heating step.

Example 5
Synthesis of Polyamic Acid Ester

In 45 g of N,N-dimethylacetamide (DMAc) were dissolved 10 g of 3,3',4,4'-diphenyl ether tetracarboxylic acid dianhydride (ODPA) and 3.87 g of isopropyl alcohol, and after adding a catalytic amount of 1,8-diazabicyclo-[5.4.0] undecene, the mixture was heated at 60° C. for 2 hours, and stirred at room temperature for 15 hours to carry out esterification.

Thereafter, 7.1 g of thionyl chloride was added to the mixture under ice-cooling, and the resulting mixture was returned to room temperature and allowed to react for 2 hours. Then, 10.6 g of 2,2-bis(3-amino-4-hydroxyphenyl) hexafluoropropane and 4.67 g of pyridine dissolved in 45 g of DMAc were added to the above mixture under ice-cooling and the mixture was stirred at room temperature for 30 minutes. The reaction mixture was added dropwise to distilled water and precipitates were collected by filtration and dried under reduced pressure to obtain a polyamic acid ester. A weight average molecular weight of this material was 24,000 and a number average molecular weight of the same was 17,000.

Protecting Reaction of Phenolic Hydroxyl Group

In 50 g γ-butyrolactone was dissolved 10 g of the polyamic acid ester obtained as mentioned above, then, 1.96 g of t-butyldimethylchlorosilane was added to the solution and the mixture was stirred under ice-cooling for 3 hours. This reaction mixture was added dropwise to distilled water, formed precipitates were collected by filtration and subjected to drying under reduced pressure to obtain a polyimide precursor represented by the formula (1). A substitution ratio for the hydroxyl group of the resulting material by the t-butyldimethylchlorosilyl group was 46%.
Evaluation of Photosensitive Characteristics To 100 parts by weight of the above-mentioned polyimide precursor was added 15 parts by weight of dimethoxyanthracenesulfonic acid diphenyl iodonium as a compound which generates an acid by irradiation of radiation, and the mixture was dissolved in 2-methoxyethanol.

The above-mentioned solution was subjected to spin coating on a silicon wafer to form a coating film with a dry film thickness of 2 to 3 μm, and then, an i-line (365 nm) exposure was carried out by using a ultra high-pressure mercury lamp through an interference filter.

After exposure, the exposed material was heated at 100° C. for 5 minutes, developed by a mixed solution of an aqueous 2.38% by weight tetramethylammonium hydroxide solution and methanol (volume ratio 5:1) until the silicon wafer at the exposed portion was exposed, and rinsed by water. As a result, a good pattern with a resolution of 15 μm and a film remaining ratio at the unexposed portion of 88% could be obtained. An exposure dose at this time was 250 mJ/cm$^2$. Incidentally, after exposure, deterioration in a pattern shape was not observed even when the material was allowed to stand for 30 minutes to 2 hours before the heating step.

Example 6

In the same manner as in Example 5 except for changing tetracarboxylic acid dianhydride used in Example 5 to 2,2-bis(3,4-dicarboxyphenyl)hexafluoropropane dianhydride, a polyimide precursor was synthesized (a weight average molecular weight: 14,500, a number average molecular weight: 11,000) and evaluation of the photosensitive characteristics was carried out in the same manner as in Example 5. As a result, a good pattern with a resolution of 10 μm and a film remaining ratio at the unexposed portion of 92% could be obtained. An exposure dose at this time was 300 mJ/cm$^2$. Incidentally, after exposure, deterioration in a pattern shape was not observed even when the material was allowed to stand for 30 minutes to 2 hours before the heating step.

Example 7

In Example 5, the protective group for the hydroxyl group was changed to an ethoxymethyl group and a polyimide precursor was synthesized, evaluation of the photosensitive characteristics was carried out in the same manner as in Example 5. As a result, a good pattern with a resolution of 15 μm and a film remaining ratio at the unexposed portion of 90% could be obtained. An exposure dose at this time was 250 mJ/cm$^2$. Incidentally, after exposure, deterioration in a pattern shape was not observed even when the material was allowed to stand for 30 minutes to 2 hours before the heating step.

Example 8

In Example 5, the compound which generates an acid by irradiation of radiation was changed to naphthalimidyl triflate and an aqueous 2.38% by weight tetramethylammonium hydroxide was used as a developer, evaluation of the photosensitive characteristics was carried out in the same manner as in Example 5. As a result, a good pattern with a resolution of 10 μm and a film remaining ratio at the unexposed portion of 90% could be obtained. An exposure dose at this time was 200 mJ/cm². Incidentally, after exposure, deterioration in a pattern shape was not observed even when the material was allowed to stand for 30 minutes to 2 hours before the heating step.

Example 9

In Example 7, the compound which generates an acid by irradiation of radiation was changed to naphthalimidyl triflate and an aqueous 2.38% by weight tetramethylammonium hydroxide was used as a developer, evaluation of the photosensitive characteristics was carried out in the same manner as in Example 5. As a result, a good pattern with a resolution of 15 μm and a film remaining ratio at the unexposed portion of 88% could be obtained. An exposure dose at this time was 200 mJ/cm². Incidentally, after exposure, deterioration in a pattern shape was not observed even when the material was allowed to stand for 30 minutes to 2 hours before the heating step.

Comparative Example 1

The procedure was carried out in the same manner as in Example 1 without effecting protection of the hydroxyl group of the polyamic acid ester which is an synthetic intermediate, and evaluation of the photosensitive characteristics was carried out in the same manner as in Example 1.

As a result, clear contract cannot be obtained in the coated film after development whereby a pattern cannot be obtained.

Comparative Example 2

The procedure was carried out in the same manner as in Example 1 without adding the compound which generates an acid by irradiation of radiation, and evaluation of the photosensitive characteristics was carried out in the same manner as in Example 1.

As a result, the exposed portion was not dissolved even when the exposed material was dipped in a developer for a long period of time and peeling occurred from the silicon wafer whereby a pattern cannot be obtained.

Comparative Example 3

The procedure was carried out in the same manner as in Example 1 except for replacing the protective group for the hydroxyl group with a t-butoxycarbonyl group to synthesize a polyimide precursor, and evaluation of the photosensitive characteristics was carried out in the same manner as in Example 1. When a heating step was carried out within 15 minutes from exposure, a good pattern with a resolution of 10 μm and a film remaining ratio at the unexposed portion of 88% could be obtained. However, the exposed material was allowed to stand for 20 minutes or longer before the heating step, the surface thereof was hardly dissolved in a developer whereby a pattern cannot be obtained.

Example 10
Synthesis of Polybenzoxazole Precursor
In 50 g of N,N-dimethylacetamide (DMAc) was dissolved 10.3 g of 4,4'-dicarboxydiphenyl ether (OBBA), and after adding 8.6 g of thionyl chloride under ice-cooling, the resulting mixture was returned to room temperature and allowed to react for 2 hours. Then, 14.6 g of 2,2-bis(3-amino-4-hydroxyphenyl)hexafluoropropane and 5.7 g of pyridine dissolved in 50 g of DMAc were added to the above mixture under ice-cooling and the mixture was stirred at room temperature for 30 minutes. The reaction mixture was added dropwise to distilled water and precipitates were collected by filtration and dried under reduced pressure to obtain a polyamide. A weight average molecular weight of this material was 14,500.
Protecting Reaction of Phenolic Hydroxyl Group
In 50 g of tetrahydrofuran was dissolved 10 g of the polyamide obtained as mentioned above, then, 28 g of 2,3-dihydropyrane and a catalytic amount of p-toluenesulfonic acid were added to the solution and the mixture was stirred at room temperature for one hour. This reaction mixture was added dropwise to distilled water, formed precipitates were collected by filtration and subjected to drying under reduced pressure to obtain a polybenzoxazole precursor represented by the formula (2). A substitution ratio for the hydroxyl group of the resulting material by the tetrahydropyranyl group was 58%.
Evaluation of Photosensitive Characteristics
To 100 parts by weight of the above-mentioned polybenzoxazole precursor was added 15 parts by weight of dimethoxyanthracenesulfonic acid diphenyl iodonium as a compound which generates an acid by irradiation of radiation, and the mixture was dissolved in 2-methoxyethanol.
The above-mentioned solution was subjected to spin coating on a silicon wafer to form a coating film with a dry film thickness of 2 to 3 μm, and then, an i-line (365 nm) exposure was carried out by using a ultra high-pressure mercury lamp through an interference filter.
After exposure, the exposed material was heated at 120° C. for 5 minutes, developed by an aqueous 2.38% by weight tetramethylammonium hydroxide solution until the silicon wafer at the exposed portion was exposed, and rinsed by water. As a result, a good pattern with a resolution of 5 um and a film remaining ratio at the unexposed portion of 95% could be obtained. An exposure dose at this time was 200 mJ/cm². Incidentally, after exposure, deterioration in a pattern shape was not observed even when the material was allowed to stand for 30 minutes to 2 hours before the heating step.

Example 11

In the same manner as in Example 10 except for changing the dicarboxylic acid with isophthalic acid, the same procedure was carried out to obtain a polybenzoxazole precursor and evaluation of the photosensitive characteristics was carried out in the same manner as in Example 10. As a result, a good pattern with a resolution of 6 μm and a film remaining ratio at the unexposed portion of 92% could be obtained. An exposure dose at this time was 400 mJ/cm². Incidentally, after exposure, deterioration in a pattern shape was not observed even when the material was allowed to stand for 30 minutes to 2 hours before the heating step. A weight average molecular weight of the polybenzoxazole precursor was 15,000.

Example 12

In the same manner as in Example 10 except for changing the dicarboxylic acid with a mixture of terephthalic acid and isophthalic acid (molar ratio; 1:1) and copolymerizing these, the same procedure was carried out to obtain a polybenzoxazole precursor and evaluation of the photosensitive characteristics was carried out in the same manner as in Example 10. As a result, a good pattern with a m resolution of 6 µm and a film remaining ratio at the unexposed portion of 93% could be obtained. An exposure dose at this time was 300 mJ/cm². Incidentally, after exposure, deterioration in a pattern shape was not observed even when the material was allowed to stand for 30 minutes to 2 hours before the heating step. A weight average molecular weight of the polybenzoxazole precursor was 14,000.

Example 13

In the same manner as in Example 10 except for changing the diamine with 4,4'-diamino-3,3'-dihydroxybiphenyl, the same procedure was carried out to obtain a polybenzoxazole precursor and evaluation of the photosensitive characteristics was carried out in the same manner as in Example 10. As a result, a good pattern with a resolution of 8 µm and a film remaining ratio at the unexposed portion of 90% could be obtained. An exposure dose at this time was 400 mJ/cm². Incidentally, after exposure, deterioration in a pattern shape was not observed even when the material was allowed to stand for 30 minutes to 2 hours before the heating step. A weight average molecular weight of the polybenzoxazole precursor was 20,000.

Example 14

In the same manner as in Example 10 except for changing the compound which generates an acid by irradiation of radiation with naphthalimidyl triflate, the same procedure was carried out to obtain a polybenzoxazole precursor and evaluation of the photosensitive characteristics was carried out in the same manner as in Example 10. As a result, a good pattern with a resolution of 6 µm and a film remaining ratio at the unexposed portion of 95% could be obtained. An exposure dose at this time was 150 mJ/cm². Incidentally, after exposure, deterioration in a pattern shape was not observed even when the material was allowed to stand for 30 minutes to 2 hours before the heating step.

Example 15
Synthesis of Polybenzoxazole Precursor

In 50 g of N,N-dimethylacetamide (DMAc) was dissolved 10.3 g of 4,4'-dicarboxydiphenyl ether (OBBA), and after adding 8.6 g of thionyl chloride under ice-cooling, the resulting mixture was returned to room temperature and allowed to react for 2 hours. Then, 14.6 g of 2,2-bis(3-amino-4-hydroxyphenyl)hexafluoropropane and 5.7 g of pyridine dissolved in 50 g of DMAc were added to the above mixture under ice-cooling and the mixture was stirred at room temperature for 30 minutes. The reaction mixture was added dropwise to distilled water and precipitates were collected by filtration and dried under reduced pressure to obtain a polyamide. A weight average molecular weight of this material was 14,500.
Protecting Reaction of Phenolic Hydroxyl Group In 50 g of γ-butyrolactone was dissolved 10 g of the polyamide obtained as mentioned above, then, 1.96 g of t-butyldimethylchlorosilane was added to the solution and the mixture was stirred under ice-cooling for 3 hours. This reaction mixture was added dropwise to distilled water, formed precipitates were collected by filtration and subjected to drying under reduced pressure to obtain a polybenzoxazole precursor represented by the formula (2). A substitution ratio for the hydroxyl group of the resulting material by the t-butyldimethylchlorosilyl group was 48%.
Evaluation of Photosensitive Characteristics To 100 parts by weight of the above-mentioned polybenzoxazole precursor was added 15 parts by weight of dimethoxyanthracenesulfonic acid diphenyl iodonium as a compound which generates an acid by irradiation of radiation, and the mixture was dissolved in 2-methoxyethanol.

The above-mentioned solution was subjected to spin coating on a silicon wafer to form a coating film with a dry film thickness of 2 to 3 µm, and then, an i-line (365 nm) exposure was carried out by using a ultra high-pressure mercury lamp through an interference filter.

After exposure, the exposed material was heated at 120° C. for 5 minutes, developed by an aqueous 2.38% by weight tetramethylammonium hydroxide solution until the silicon wafer at the exposed portion was exposed, and rinsed by water. As a result, a good pattern with a resolution of 8 µm and a film remaining ratio at the unexposed portion of 90% could be obtained. An exposure dose at this time was 250 mJ/cm². Incidentally, after exposure, deterioration in a pattern shape was not observed even when the material was allowed to stand for 30 minutes to 2 hours before the heating step.

Example 16

In the same manner as in Example 15 except for changing the dicarboxylic acid with a mixture of terephthalic acid and isophthalic acid (molar ratio; 1:1) and copolymerizing these, the same procedure was carried out to obtain a polybenzoxazole precursor and evaluation of the photosensitive characteristics was carried out in the same manner as in Example 15. As a result, a good pattern with a resolution of 10 µm and a film remaining ratio at the unexposed portion of 88% could be obtained. An exposure dose at this time was 300 mJ/cm². Incidentally, after exposure, deterioration in a pattern shape was not observed even when the material was allowed to stand for 30 minutes to 2 hours before the heating step. A weight average molecular weight of the polybenzoxazole precursor was 14,000.

Example 17

In the same manner as in Example 15 except for changing the protective group for the hydroxyl group with an ethoxymethyl group, the same procedure was carried out to obtain a polybenzoxazole precursor and evaluation of the photosensitive characteristics was carried out in the same manner as in Example 15. As a result, a good pattern with a resolution of 6 µm and a film remaining ratio at the unexposed portion of 90% could be obtained. An exposure dose at this time was 300 mJ/cm². Incidentally, after exposure, deterioration in a pattern shape was not observed even when the material was allowed to stand for 30 minutes to 2 hours before the heating step.

Example 18

In the same manner as in Example 15 except for changing the compound which generates an acid by irradiation of radiation with naphthalimidyl triflate, the same procedure was carried out to obtain a polybenzoxazole precursor and evaluation of the photosensitive characteristics was carried out in the same manner as in Example 15. As a result, a good pattern with a resolution of 8 µm and a film remaining ratio at the unexposed portion of 90% could be obtained. An exposure dose at this time was 150 mJ/cm². Incidentally, after exposure, deterioration in a pattern shape was not observed even when the material was allowed to stand for 30 minutes to 2 hours before the heating step.

Example 19

In the same manner as in Example 17 except for changing the compound which generates an acid by irradiation of radiation with naphthalimidyl triflate, the same procedure was carried out to obtain a polybenzoxazole precursor and evaluation of the photosensitive characteristics was carried out in the same manner as in Example 15. As a result, a good pattern with a resolution of 6 μm and a film remaining ratio at the unexposed portion of 92% could be obtained. An exposure dose at this time was 150 mJ/cm². Incidentally, after exposure, deterioration in a pattern shape was not observed even when the material was allowed to stand for 30 minutes to 2 hours before the heating step.

Comparative Example 4

The procedure was carried out in the same manner as in Example 10 without effecting protection of the hydroxyl group of the polyamic acid ester which is an synthetic intermediate, and evaluation of the photosensitive characteristics was carried out in the same manner as in Example 10.

As a result, clear contract cannot be obtained in the coated film after development whereby a pattern cannot be obtained.

Comparative Example 5

The procedure was carried out in the same manner as in Example 10 without adding the compound which generates an acid by irradiation of radiation, and evaluation of the photosensitive characteristics was carried out in the same manner as in Example 10.

As a result, the exposed portion was not dissolved even when the exposed material was dipped in a developer for a long period of time and peeling occurred from the silicon wafer whereby a pattern cannot be obtained.

Comparative Example 6

The procedure was carried out in the same manner as in Example 10 except for replacing the protective group for the hydroxyl group with a t-butoxycarbonyl group to synthesize a polyimide precursor, and evaluation of the photosensitive characteristics was carried out in the same manner as in Example 10. When a heating step was carried out within 15 minutes from exposure, a good pattern with a resolution of 10 μm and a film remaining ratio at the unexposed portion of 88% could be obtained. However, the exposed material was allowed to stand for 20 minutes or longer before the heating step, the surface thereof was hardly dissolved in a developer whereby a pattern cannot be obtained.

The positive type photosensitive resin composition of the present invention is excellent in sensitivity, resolution and heat resistance.

Also, according to the process for producing a pattern according to the present invention, by the use of the above-mentioned resin composition, a pattern having a good shape excellent in sensitivity, resolution and heat resistance can be obtained.

Moreover, the electronic parts of the present invention have high reliability since they have good shape and excellent characteristics.

What is claimed is:

1. A positive photosensitive resin composition comprising:

(A) a polyimide precursor having a group represented by
—OR,
wherein R represents a group constituting a mono-valent acetal or ketal, an alkoxyalkyl group or an alkylsilyl group, which can be converted into a hydrogen atom by an action of an acid, in the molecule which is bonded to an aromatic ring; and (B) a compound which generates an acid by irradiating radiation.

2. The positive photosensitive resin composition according to claim 1, wherein the component (A) is a polyimide precursor having a structural unit represented by the formula (1):

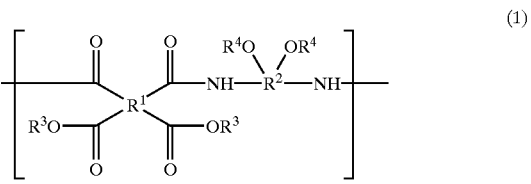

wherein $R^1$ and $R^2$ each independently represent a tetravalent organic group; each $R^3$ independently represents a monovalent organic group; each $R^4$ independently represents a monovalent group constituting acetal or ketal, an alkoxyalkyl group or an alkylsilyl group, which can be converted into a hydrogen atom by decomposition with an action of an acid.

3. The positive photosensitive resin composition according to claim 2, wherein $R^1$ in the formula (1) is a tetravalent group having a chemical structure of an aromatic group substituted by an aprotic electron donative group or a fluorinated alkyl group in an aromatic group having four bonding arms.

4. The positive photosensitive resin composition according to claim 2, wherein $R^2$ in the formula (1) is a tetravalent group having chemical structure of an aromatic group substituted by an aprotic electron donative group in an aromatic group having four bonding arms or aromatic groups having bonding arms and adjacent to each other through an ether bond or ether bonds.

5. The positive photosensitive resin composition according to claim 1, wherein (B) the compound which generates an acid by irradiating radiation is contained in an amount of 0.01 to 50 parts by weight based on 100 parts by weight of (A) the polyimide precursor.

6. The positive photosensitive resin composition according to claim 5, wherein $R^1$ in the formula (1) is a tetravalent group having a chemical structure of an aromatic group substituted by an aprotic electron donative group or a fluorinated alkyl group in the aromatic group in which a substituent is present.

7. The positive photosensitive resin composition according to claim 5, wherein $R^2$ in the formula (1) is a tetravalent group having chemical structure of an aromatic group substituted by an aprotic electron donative group in the aromatic group in which a substituent is present or an aromatic group adjacent thereto through an ether bond.

8. The positive photosensitive resin composition according to claim 2, wherein the polyimide precursor is a reaction product of a tetracarboxylic acid dianhydride represented by the following formula (3) and a diamino compound represented by the following formula (4) as a part of the starting materials:

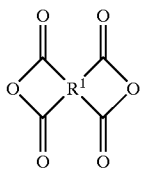

(3)

wherein R¹ has the same meaning as defined in the formula (1),

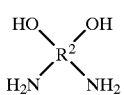

(4)

wherein R² has the same meaning as defined in the formula (1).

9. The positive photosensitive resin composition according to claim 8, wherein the compound represented by the formula (3) is at least one compound selected from the group consisting of 3,3',4,4'-diphenyl ether tetracarboxylic acid dianhydride, 1,4-dimethoxy-2,3,5,6-benzenetetracarboxylic acid dianhydride, 1,4-ditrimethylsilyl-2,3,5,6-benzenetetracarboxylic acid dianhydride, 1,4-bis(3,4-dicarboxyphenoxy)benzene dianhydride, 1,3-bis(3,4-dicarboxyphenoxy)benzene dianhydride, 3,3',4,4'-diphenylmethane tetracarboxylic acid dianhydride, bis(3,4-dicarboxyphenoxy)dimethylsilane dianhydride, bis(3,4-dicarboxyphenoxy)methylamine dianhydride, 4,4'-bis(3,4-dicarboxyphenoxy)diphenylsulfone dianhydride, 2,2-bis(3,4-dicarboxyphenyl)hexafluoropropane dianhydride and 2,2-bis(3,4-dicarboxyphenyl)-1,1,1-trifluoropropane dianhydride.

10. The positive photosensitive resin composition according to claim 8, wherein R² in the compound represented by the formula (4) is selected from the group consisting of benzophenone, diphenylsulfone, diphenylsulfoxide, diphenylhexafluoropropane and bis(trifluoromethyl)-biphenyl.

11. The positive photosensitive resin composition according to claim 1, wherein (B) the compound which generates an acid by irradiating radiation is at least one selected from the group consisting of diaryl sulfonium salts, triaryl sulfonium salts, dialkylphenasyl sulfonium salts, diaryl iodonium salts, aryldiazonium salts, aromatic tetracarboxylates, aromatic sulfonates, nitrobenzyl esters, aromatic N-oxyimidosulfonates, aromatic sulfamides and naphthoquinone diazide-4-sulfonates.

12. A process for producing a pattern comprising the steps of:

a step of coating the positive photosensitive resin composition as defined in claim 1 on a support and drying the same, a step of subjecting to exposure, a step of developing the exposed material by using an aqueous alkaline solution and a step of subjecting to heat treatment.

13. Electronic parts which have the pattern prepared by the process as defined in claim 12 as a surface protective film or an interlayer insulating film.

* * * * *